United States Patent
Kurosaki

(10) Patent No.: US 6,751,133 B2
(45) Date of Patent: Jun. 15, 2004

(54) SEMICONDUCTOR MEMORY WHICH HAS REDUCED FLUCTUATION OF WRITING SPEED

(75) Inventor: Kazuhide Kurosaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/245,302

(22) Filed: Sep. 18, 2002

(65) Prior Publication Data

US 2003/0063494 A1 Apr. 3, 2003

(30) Foreign Application Priority Data

Sep. 28, 2001 (JP) ........................................ 2001-303709

(51) Int. Cl.$^7$ ................................................. G11C 7/00
(52) U.S. Cl. .............................. 365/189.11; 365/189.09; 365/226
(58) Field of Search ..................... 365/189.11, 189.01, 365/189.09, 185.2, 185.21, 185.22, 185.18, 185.17, 226; 327/540, 541

(56) References Cited

U.S. PATENT DOCUMENTS

| | | | |
|---|---|---|---|
| 5,673,223 A | 9/1997 | Park | 365/185.17 |
| 6,081,453 A * | 6/2000 | Iwahashi | 365/185.22 |
| 6,438,035 B2 * | 8/2002 | Yamamoto et al. | 365/185.21 |

* cited by examiner

Primary Examiner—Gene Auduong
(74) Attorney, Agent, or Firm—Armstrong, Kratz, Quintos, Hanson & Brooks, LLP.

(57) ABSTRACT

The non-volatile semiconductor memory of the present invention is comprised of: a memory cell array including a plurality of memory cells which is disposed at intersections of a plurality of bit lines and word lines and are connected to said bit lines; and a writing circuit which receives an address signal and supplies a bit line voltage to the bit line connected to the memory cell selected with the address signal during writing operation. The writing circuit changes, based on the address signal, a level of the bit line voltage depending on a position of the selected memory cell in the memory cell array. The writing circuit operates, based on the inputted writing address, to further increase a level of the bit line voltage supplied to the memory cell as the wiring distance via the bit line from the output end of the bit line voltage of the writing circuit thereto is longer, fluctuation of writing speed in each memory cell of a memory cell array is reduced.

9 Claims, 6 Drawing Sheets

SEMICONDUCTOR MEMORY WHICH HAS REDUCED FLUCTUATION OF WRITING SPEED

BACKGROUND OF THE INVENTION

1. Field of the Invention

The present invention generally relates to a semiconductor memory; and particularly, to a non-volatile semiconductor memory (such as, flash memory or the like). The present invention relates to a non-volatile semiconductor memory, which has reduced fluctuation of writing speed when the data is written to memory cells.

2. Description of the Related Art

A flash memory generally includes a non-volatile memory cell having a control gate connected to the word lines, a drain connected to the bit lines, a source connected to the source lines and a floating gate, and includes a memory cell array composed of a plurality of the non-volatile memory cells arranged in the shape of a matrix.

In the flash memory, writing (programming) operation to each memory cell can be executed by applying a predetermined high voltage to each control gate and drain to make conductive a transistor of memory cell and then injecting channel hot electrons to the floating gate in order to accumulate electrons in the floating gate.

In view of attaining higher writing speed, a voltage applied to the drain of each memory cell must be set as high as possible during the writing operation. However, if the drain voltage is set to an excessively higher value, drain disturbance occurs in the non-selected memory cells adjacent to the selected memory cells; thereby, resulting in charge-loss in which the electrons accumulated in the floating gate are lost. Therefore, a level of the drain voltage must be within a predetermined constant range.

A flash memory includes a writing circuit which comprises a voltage boost circuit and a regulation circuit and controls the writing (programming) operation to the memory cells. The writing circuit is connected to each memory cell via the bit lines.

In the existing flash memory, the writing circuit generates a voltage $V_{PUMP}$ boosted from the power source voltage $V_{CC}$ in the voltage boost circuit and regulates the boosted voltage $V_{PUMP}$ to a predetermined constant level in the regulation circuit. Thereafter, during the writing operation, the writing circuit supplies the voltage $V_{bit}$ regulated to the above constant level to the bit line connected to each memory cell as the drain voltage.

However, in recent years, a memory cell array is designed to have a wide area because a flash memory now has a larger capacity. Therefore, a longer bit line is also laid in the memory cell array. Accordingly, a voltage drop in the bit lines, which is generated by a writing current flowing into the memory cell during the writing operation, is also increased.

Therefore, it is difficult, in all memory cells within the memory cell array, to maintain the level of drain voltage to the predetermined constant range during the writing operation. When the level of the drain voltage is fluctuated in each memory cell during the write operation, it causes a problem such that fluctuation of the writing speed depending on the positions of the memory cells within the memory cell array is generated. This problem will prevent higher speed operation of a flash memory.

SUMMARY OF THE INVENTION

The present invention has been proposed with the above problems in mind; and it is therefore a general object of the present invention to provide high speed operation of a flash memory by reducing fluctuation of the writing speed in each memory cell of the memory cell array.

Another and a more specific object of the present invention is to provide a semiconductor memory comprising: a memory cell array including a plurality of memory cells which is disposed at intersections of a plurality of bit lines and word lines and are connected to said bit lines; and a writing circuit which receives an address signal and supplies a bit line voltage to the bit line connected to the memory cell selected with said address signal during writing operation, wherein said writing circuit changes, based on said address signal, a level of said bit line voltage depending on a position of said selected memory cell in said memory cell array.

At least a part of the writing address is inputted to the writing circuit during writing operation. The writing circuit of the present invention operates, based on the inputted writing address, to more increase a level of the bit line voltage supplied to the memory cell to which the wiring distance via the bit line from the output end of the bit line voltage of the writing circuit is longer. Therefore, the bit line voltage of the adequate level, depending on the position of the memory cell in the memory cell array, can be supplied to each memory cell; and thereby, fluctuation of writing speed in each memory cell of a memory cell array is reduced.

DESCRIPTION OF THE PREFERRED EMBODIMENT

Figure 1:
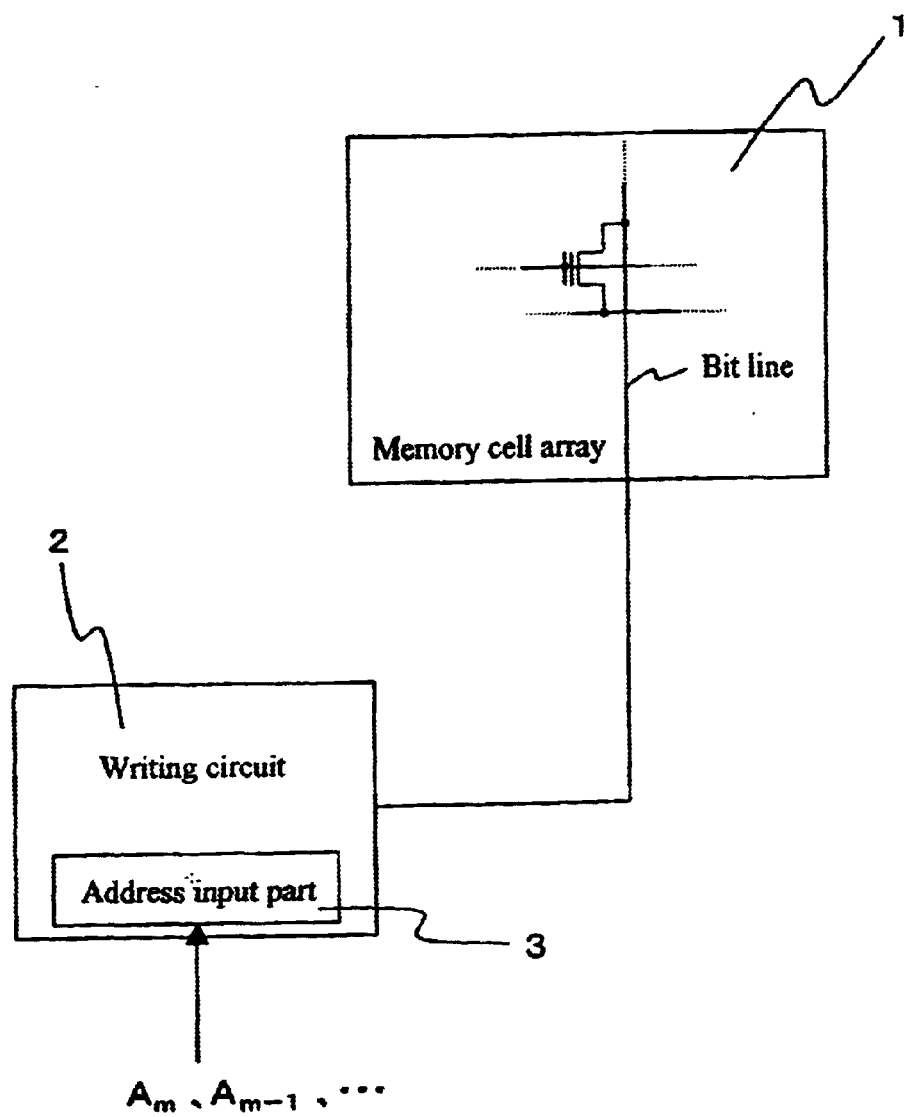
FIG. 1 is a schematic diagram of a non-volatile semiconductor memory for explaining the principle of the present invention.

FIG. 1 is a schematic diagram of a non-volatile semiconductor memory for explaining the principle of the present invention.

In this figure, numeral 1 designates a memory cell array; numeral 2, a writing circuit and numeral 3, an address input part.

In FIG. 1, the writing circuit 2 is connected to the memory cell array 1 and supplies a predetermined bit line voltage to the bit line connected to each memory cell in the memory cell array 1 during the writing operation. Moreover, the writing circuit 2 is also provided with the address input part to which an address is supplied during the writing operation.

In the non-volatile semiconductor memory of the present invention, at least a part of the writing address is inputted to the writing circuit 2. The writing circuit of the present invention changes, depending on the inputted writing address, the level of a bit line voltage supplied to the bit lines in the memory cell array 1 during the writing operation.

In other words, the writing circuit of the present invention changes a bit line voltage to be supplied to the bit lines during the writing operation depending on the wiring distance via the bit lines from the output end of the bit line voltage of the write circuit 2 to the memory cells to be written within the memory cell array 1.

More particularly, the writing circuit of the present invention operates, based on the inputted writing address, to further boost the level of the bit line voltage supplied during the writing operation to the memory cell to which the wiring distance via the bit lines from the output end of the bit line voltage of the writing circuit 2 is longer.

As explained above, in the non-volatile semiconductor memory of the present invention, a bit line voltage of the adequate level depending on the position of the memory cell in the memory cell array can be supplied to each memory cell based on the writing address. Therefore, even if a flash memory has a large capacity, influence of voltage drop of the bit line can be reduced and fluctuation of the writing speed in each memory cell can also be reduced.

The preferred embodiments of the present invention will be explained with reference to the accompanying drawings. However, the embodiments of the present invention do not restrict the technical scope of the present invention and the technical field of the present invention allows various changes and modifications and is restricted only with the scope of the claims thereof.

Figure 2:
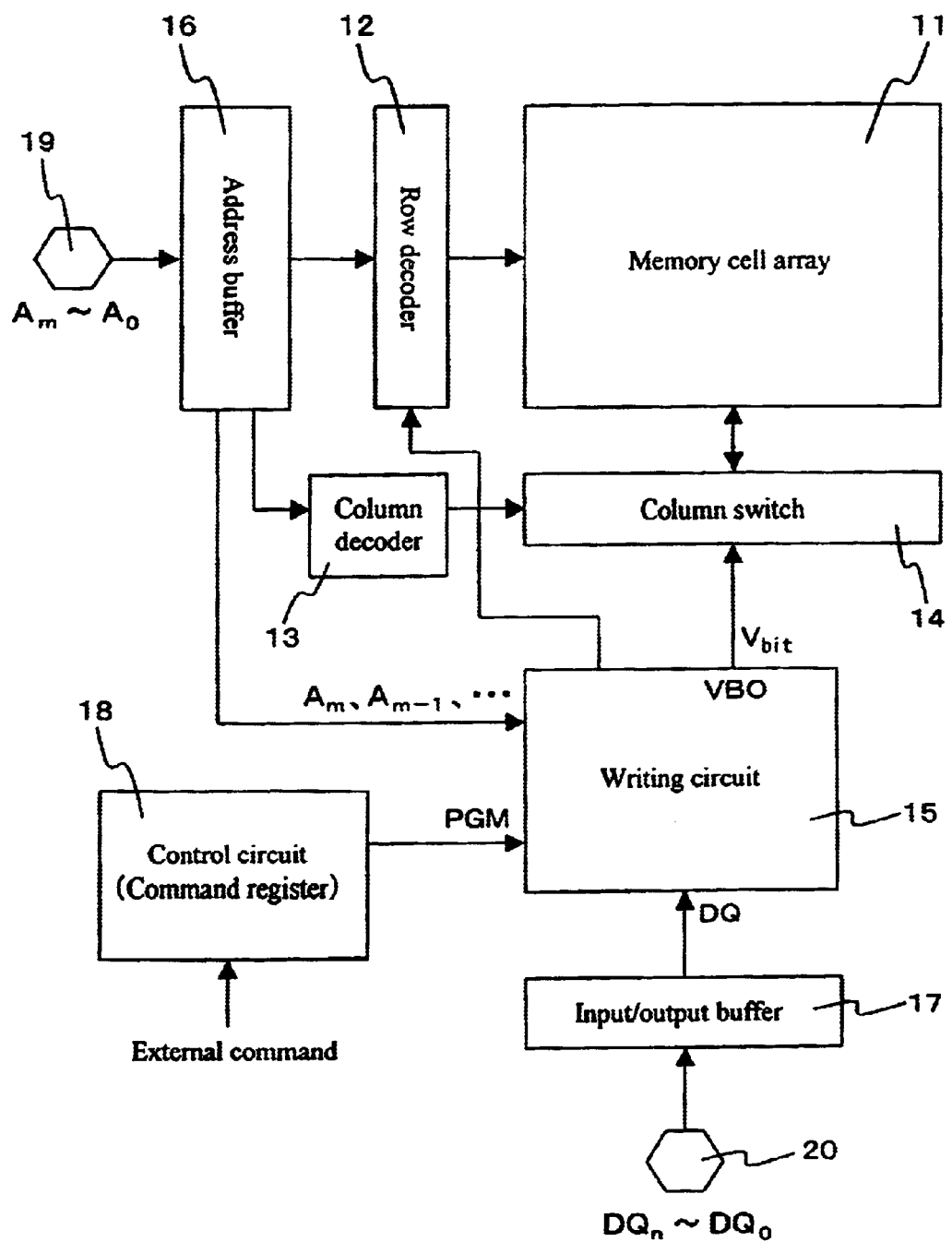
FIG. 2 is a schematic structural diagram showing the essential portion of the non-volatile semiconductor memory of the present invention.

FIG. 2 is a schematic diagram showing the essential portion of the non-volatile semiconductor memory of the present invention. In this figure, the numeral 11 designates a memory cell array; numeral 12, a row decoder; numeral 13, a column decoder; numeral 14, a column switch; numeral 15, a writing circuit; numeral 16, an address buffer; numeral 17, an input/output buffer; numeral 18, a control circuit; numeral 19, an address input terminal and numeral 20, a data input/output terminal.

In the non-volatile semiconductor memory of FIG. 2, a plurality of non-volatile memory cells are arranged in the shape of a matrix in the memory cell array 11. Moreover, a row decoder 12 for selecting the word line, a column switch 14 connected to the bit lines and a column decoder 13 for selecting the column switch 14 are provided for the memory cell array 11.

The address signals $A_m$ to $A_0$, consisting of m bits, are inputted to the address buffer 16 from an external circuit via the address input terminal 19. The address buffer 16 supplies these address signals to the row decoder 12 and column decoder 13. The data signals $DQ_n$ to $DQ_0$, consisting of n bits, are inputted to the input/output buffer 17 from an external circuit via the data input/output terminal 20. The input/output buffer 17 supplies these data signal to the column switch 14 via the writing circuit 15.

The control circuit 18 comprises a command register to decode a command supplied from an external circuit and control each internal circuit to execute operations (such as, writing (programming), erasing and reading operations) to the memory cell array 11. During the writing operation, a program signal PGM is supplied to the writing circuit 15.

When the writing circuit 15 receives a control signal (program signal PGM) for instructing the writing (programming) operation from the control circuit 18, the writing circuit 15 supplies a high voltage for writing data, via the row decoder 12 and column switch 14, to the word lines and bit lines connected to the memory cells to be written in the memory cell array 11. The high voltage for writing data is applied to the control gate and drain of the memory cells to be written for injection of electrons to the floating gate. For example, 9V is applied to the control gate, while 5V is applied to the drain.

As shown in FIG. 2, the address signals $A_m, A_{m-1}, \ldots$ are inputted to the writing circuit 15 of the present invention from the address buffer 16. Here, the address signals to be inputted may be applied to all bits or a part of bits. For example, the significant two bits of the row address is inputted to the writing circuit 15. Moreover, if the memory cell array is comprised of a plurality of blocks and the block address is defined, it is also possible to provide that the block address signal is inputted to the writing circuit 15.

The writing circuit 15 changes the level of the bit line voltage $V_{bit}$ supplied to the bit lines in the memory cell array based on the inputted address signal. In other words, the writing circuit 15 operates to further boost the bit line voltage $V_{bit}$ as the wiring distance is longer, depending on such wiring distance via the bit lines up to the memory cells to be written from the output end VBO of the bit line voltage $V_{bit}$.

When the wiring distance is longer, a difference between a voltage value actually applied to the drain of the memory cells to be written and a voltage value at the output end VBO of the writing circuit becomes larger resulting from voltage drop in the bit lines within the memory cell array. As a result, in the system for supplying a constant voltage to the bit lines during the writing operation, it is difficult to maintain the drain voltage within a constant operation ensuring range, for example, the range of 4 to 5V in all memory cells in the memory cell array.

Therefore, the writing circuit of the present invention previously sets, while supplying a drain voltage to the memory cell having longer wiring distance, the level of the bit line voltage $V_{bit}$ based on the inputted writing address so that the actual voltage value at the drain of the memory cells to be written can be set within the above-explained operation ensuring range.

Thereby, in the non-volatile semiconductor memory of the present invention, since the level of the drain voltage during the writing operation can be set within a constant range, fluctuation of the writing speed in each memory cell can be reduced.

Figure 3:
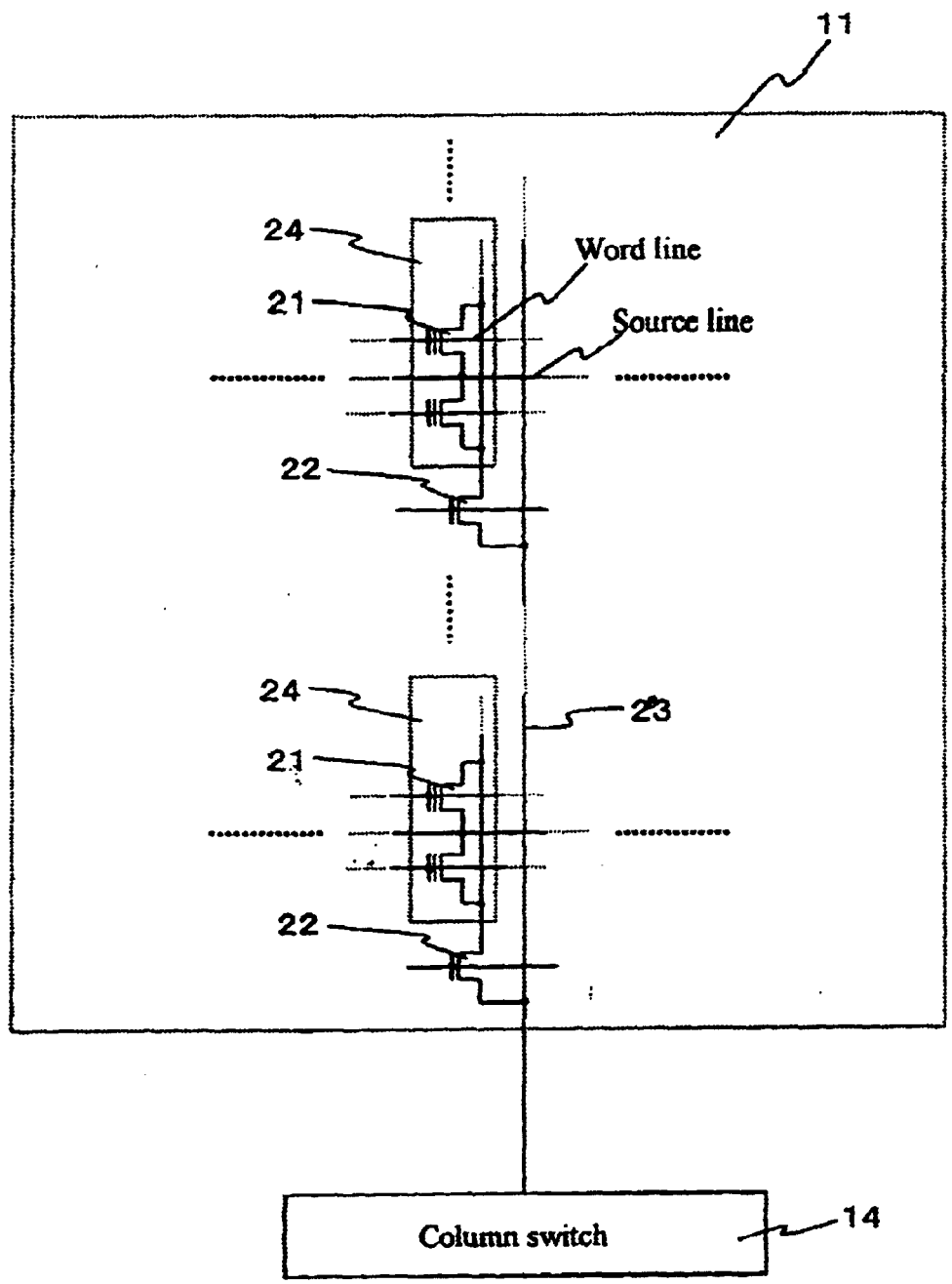
FIG. 3 is a schematic structural diagram showing the essential portion of a memory cell array of the present invention.

FIG. 3 is a schematic diagram showing the essential portion of the memory array 11 of the present invention. In this figure, the elements like those in FIG. 2 are designated with the like reference numerals. Numeral 21 designates a memory cell; numeral 22, a sector select transistor; numeral 23, a bit line and numeral 24, a sector.

As shown in FIG. 3, the memory cell array 11 is divided into a plurality of sectors 24 in the bit line direction with a plurality of sector select transistors 22. The memory cell 21 is connected to the bit line 23 via the sector select transistor 22. Each bit line 23 is connected to the column switch 14 and is then connected to the writing circuit 15 via the column switch 14.

Each sector select transistor 22 receives a sector select signal at its gate and is turned ON with the sector select signal when the memory cells to be written are included in the corresponding sector 24. Meanwhile, the sector select transistors corresponding to the sector where the memory cells to be written do not exist are turned OFF.

As mentioned above, when the memory cells including longer wiring distance via the bit line from the output end VBO of the bit line voltage $V_{bit}$ are to be written, the writing circuit 15 supplies the bit line voltage $V_{bit}$ of the high level corresponding to the wiring distance to the bit line 23. In this case, an excessively higher voltage is applied to the drain of the memory cells not to be written which are connected to the same bit line as that connected to the memory cell to be written and to which the wiring distance is shorter. Therefore, in such memory cells not to be written, it is possible to have drain disturbance to be generated; and electrons accumulated in the floating gate are lost.

However, since the sector select transistors corresponding to the sectors to which the above memory cells not to be written belong are turned OFF, the memory cells not to be written are isolated electrically from the bit lines, which are set to the excessively higher level. Therefore, an excessively higher drain voltage is prevented from being applied to the memory cells not to be written which are connected to the same bit line as that connected to the memory cells to be written and located in the positions of the shorter wiring distance which consequently generates drain disturbance.

Figure 4:
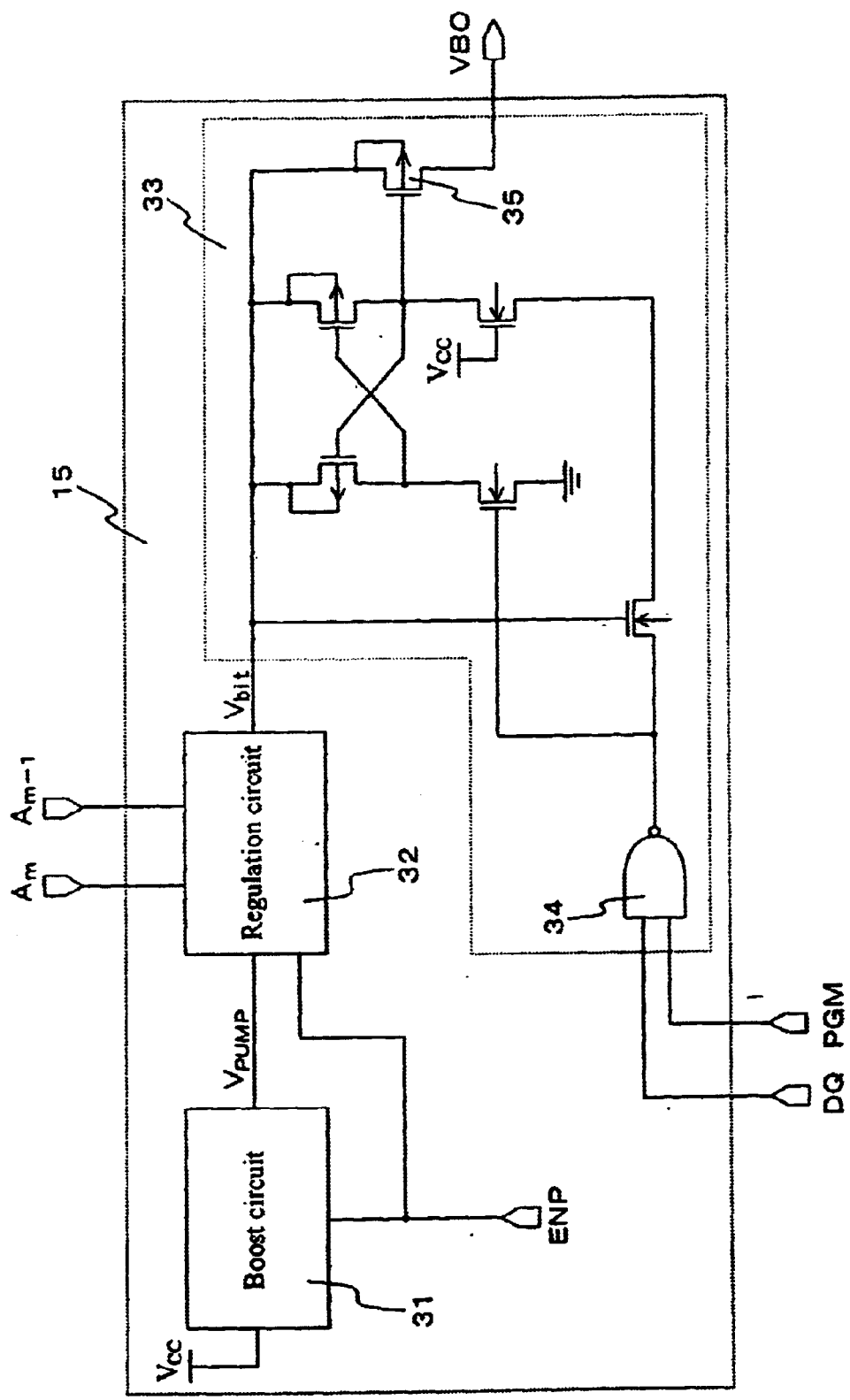
FIG. 4 is a schematic structural diagram showing an internal structure of a write circuit of the present invention.

FIG. 4 shows a schematic structural diagram showing an internal structure of the writing circuit 15 of the present invention. In this figure, the numeral 31 designates a voltage boost circuit; numeral 32, a regulation circuit and numeral 33, a bit line voltage supply circuit. As shown in FIG. 4, the writing circuit 15 comprises the voltage boost circuit, regulation circuit 32 and bit line voltage supply circuit 33.

Inside the writing circuit, when the program signal PGM is supplied to the writing circuit from the control circuit, an activation signal ENP of the internal circuit (such as, the voltage boost circuit and regulation circuit) is generated in response to such program signal PGM.

When the power source voltage $V_{CC}$, for example, of about 3V is supplied to the voltage boost circuit 31, this voltage boost circuit 31 generates a voltage value higher than the power source voltage $V_{CC}$, for example, the boosted voltage $V_{PUMP}$ of about 5V and then outputs this boosted voltage to the regulation circuit 32.

When the boosted voltage $V_{PUMP}$ is inputted, the regulation circuit 32 generates the bit line voltage $V_{bit}$ by regulating the boosted voltage $V_{PUMP}$ to a predetermined constant level and then outputs this bit line voltage $V_{bit}$ to the bit line voltage supply circuit 33. An address signal is inputted to the regulation circuit 32. In FIG. 4, the significant two bits $A_m$, $A_{m-1}$, of the row address in the writing operation are inputted. Moreover, an activation signal ENP is inputted to the regulation circuit 32.

The regulation circuit 32 is activated in response to the activation signal ENP and changes the above constant level of the bit line voltage $V_{bit}$ for regulation on the basis of the inputted writing address signal. A detailed circuit structure of the regulation circuit 32 will be explained later.

The bit line voltage $V_{bit}$ from the regulation circuit 32, the data signal DQ from the input buffer and the program signal PGM from the control circuit are inputted to the bit line voltage supply circuit 33. The data signal DQ and program signal PGM are inputted to a NAND gate 34 to obtain a negative logical product. Moreover, the input node of the bit line voltage $V_{bit}$ is connected to the output end VBO of the writing circuit 15 via the PMOS transistor 35. As shown in FIG. 4, the PMOS transistor 35 is turned ON/OFF in response to the data signal $DQ_n$ and program signal PGM.

Here, operations of the bit line voltage supply circuit 33 will be explained. When the writing (programming) operation is not instructed to the writing circuit 15 from the control circuit and the program signal PGM is in the L level, the PMOS transistor 35 is turned OFF regardless of the H/L levels of the data signal DQ; and the bit line voltage $V_{bit}$ is not supplied from the output end VBO of the writing circuit.

When the writing (programming) operation is instructed to the writing circuit 15 from the control circuit and the program signal PGM is in the H level, if the data signal DQ is in the H level, the PMOS transistor 35 turns ON and the bit line voltage $V_{bit}$ generated by the regulation circuit 32 is supplied to the bit line in the memory cell array via the output end VBO. Therefore, the high voltage for writing data is applied to the drain of the memory cell to be written; and electrons are injected to the floating gate.

On the other hand, if the program signal PGM is in the H level and the data signal DQ is in the L level, the PMOS transistor 35 is turned OFF. Therefore, the bit line voltage $V_{bit}$ is not supplied to the bit line in the memory cell array. Consequently, electrons are not injected to the floating gate of the memory cell.

Figure 5:
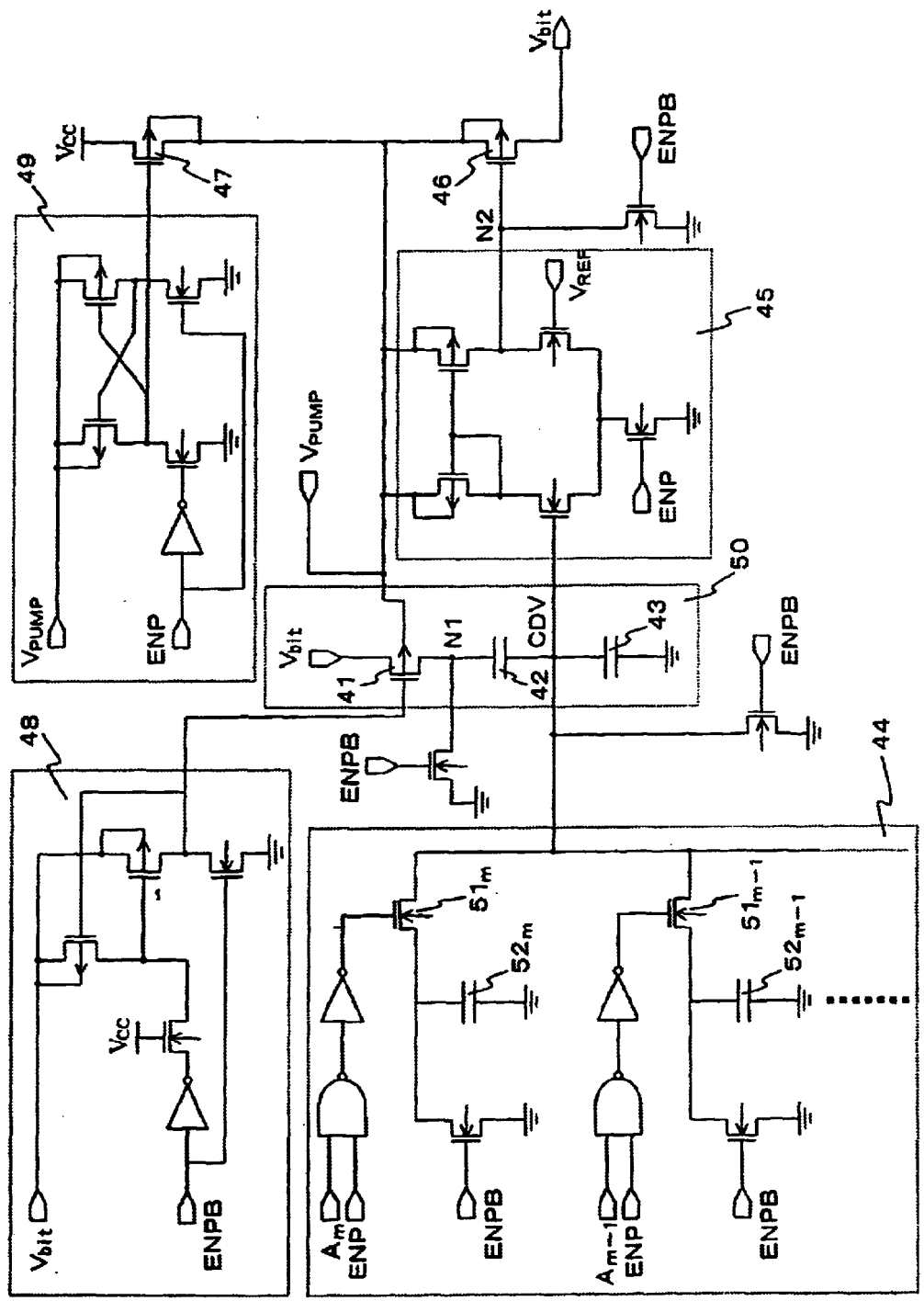
FIG. 5 is a circuit structure diagram showing an internal structure of a regulation circuit of the present invention.

FIG. 5 shows a circuit structure showing the internal structure of the regulation circuit 32 of the present invention. In this figure, the numeral 41 designates a PMOS transistor; numerals 42, 43, capacitors for bit line voltage regulation; numeral 44, a capacitance regulating part of capacitors; numeral 45, a voltage comparing part; numeral 46, a PMOS transistor for bit line voltage regulation; numeral 47, a PMOS transistor; numeral 48, a switch control part of the PMOS transistor 41; numeral 49, a switch control part of the PMOS transistor 47; numeral 50, a comparison voltage generating part; numeral 51, a switch transistor; numeral 52, a capacitor. ENPB indicates an inverted signal of the activation signal ENP.

In the comparison voltage generating part 50 of FIG. 5, the PMOS transistor 41, capacitor 42 and capacitor 43 are sequentially connected in series between the output node of bit line voltage $V_{bit}$ and the ground $V_{SS}$. The switch control part 48 is connected to the gate of PMOS transistor 41. The switch control part 48 turns ON the PMOS transistor 41 in response to the activation signal ENP of H level.

When the activation signal ENP is in the H level, the bit line voltage $V_{bit}$ is supplied to the connection node N1 of the PMOS transistor 41 and capacitor 42 via the PMOS transistor 41. Therefore, a voltage of the connection node CDV of the capacitors 42 and 43 becomes equal to the value obtained by dividing the bit line voltage $V_{bit}$ according to a capacitance ratio of the capacitors 42 and 43. That is, during the writing operation, a voltage of the node CDV is expressed as follows (hereafter referred to as formula 1):

$$V_{CDV}=V_{bit} \times (C_A/(C_A+C_B)),$$

wherein, $C_A$, $C_B$ are respectively capacitance values of the capacitors 42 and 43.

The connection node CDV is connected to the voltage comparing part 45 as one input thereof. The reference voltage $V_{REF}$ generated by a reference voltage generating circuit (not illustrated) is supplied to the voltage comparing part 45 as the other input thereof. The reference voltage $V_{REF}$ is, for example, about 1.3V.

When the voltage $V_{CDV}$ of the node CDV is higher than the reference voltage $V_{REF}$ ($V_{CDV} > V_{REF}$) as a result of comparison between the voltage $V_{CDV}$ of node CDV and reference voltage $V_{REF}$, the voltage comparing part 45 supplies the voltage of H level to the node N2. When the voltage $V_{CDV}$ of node CDV is lower than the reference voltage $V_{REF}$ ($V_{CDV} < V_{REF}$), the voltage comparing part 45 supplies the voltage of L level to the node N2.

The node N2 is connected to the gate of the PMOS transistor 46 for bit line voltage regulation. The source of the PMOS transistor 46 is connected to the input node of the boosted voltage $V_{PUMP}$ from the voltage boost circuit 31 and the drain thereof is connected to the output node of the bit line voltage $V_{bit}$. Therefore, the PMOS transistor 46 is controlled of ON/OFF states in response to the voltage of the node N2 which is outputted as a result of the above comparing operation in the voltage comparing part 45; and thereby, regulates the level of the bit line voltage $V_{bit}$ outputted from the drain thereof.

The source of the PMOS transistor 46 is also connected to the power source voltage $V_{CC}$ via the PMOS transistor 47, but the PMOS transistor 47 is turned OFF with the switch control part 49 in response to the activation signal ENP of the H level.

Here, the bit line voltage $V_{bit}$ outputted from the drain of the PMOS transistor 46 is fed back to the source of the PMOS transistor 41 of the comparison voltage generating part 50. That is, the voltage $V_{CDV}$ of the node CDV inputted to the voltage comparing part 45 also changes depending on level change of the bit line voltage $V_{bit}$ outputted from the drain of the PMOS transistor 46.

During the writing operation, a writing current flows to each memory cell; and thereby, the electrons are injected to the floating gate. Therefore, the level of the bit line voltage $V_{bit}$ is gradually lowered with passage of time. However, as can be understood from the formula 1, when the bit line voltage $V_{bit}$ is reduced, the voltage $V_{CDV}$ of the node CDV is also reduced. When the voltage $V_{CDV}$ of the node CDV becomes lower than the reference voltage $V_{REF}$, the node N2 becomes L level in response to such voltage $V_{CDV}$. Accordingly, the PMOS transistor 46 is turned ON and the level of the bit line voltage $V_{bit}$ is thereby controlled to rise.

When the voltage $V_{CDV}$ of the node CDV becomes higher than the reference voltage $V_{REF}$ due to rise of the level of bit line voltage $V_{bit}$, the node N2 becomes high level in response to such voltage $V_{CDV}$. Therefore, the PMOS transistor 46 is turned OFF; and then, the level of bit line voltage $V_{bit}$ is reduced again resulting from the writing current.

As explained above, the regulation circuit 32 controls voltages so that the voltage $V_{CDV}$ of the node CDV becomes equal to the reference voltage $V_{REF}$ through mutual cooperation of the comparison voltage generating part 50, voltage comparing part 45 and PMOS transistor 46. Therefore, the regulation circuit of the present invention can regulate the bit line voltage $V_{bit}$ to the predetermined constant level. That is, the bit line voltage $V_{bit}$ regulated to the constant level is expressed as follows by setting $V_{CDV}=V_{REF}$ in the formula 1 (hereafter referred to as formula 2):

$$V_{CDV}=V_{REF}$$
$$V_{bit}=V_{REF}\times(1+(C_B/C_A))$$

wherein, the practical values of $C_A$, $C_B$ may be set adequately in accordance with the level of the bit line voltage $V_{bit}$ to be supplied.

As can be understood from the formula 2, the constant level of the bit line voltage $V_{bit}$ regulated by the regulation circuit of the present invention can be determined with a capacitance ratio of the capacitors 42 and 43. Therefore, the constant level of the bit line voltage $V_{bit}$ regulated by the regulation circuit can be varied by changing a capacitance ratio of these capacitors.

Accordingly, in the regulation circuit of the present invention, the capacitance regulating part 44 is connected to the node CDV in order to vary the above capacitance ratio of the capacitors. The capacitance regulating part 44 changes a substantial capacitance value of the capacitors existing between the node CDV and the ground $V_{SS}$ in the basis of the writing address.

The activation signal ENP and address signals $A_m$, $A_{m-1}$, ... are inputted to the capacitance regulating part 44. All bits or a part of bits of the address signal may be inputted, as required. For example, the significant two bits $A_m$, $A_{m-1}$ of the row address signal during the writing operation are inputted. When the block address is defined, the block address signal may be inputted.

In the capacitance regulating part 44, a plurality of capacitors $52_m$, $52_{m-1}$, ... are respectively connected in parallel via the switch transistors $51_m$, $51_{m-1}$, ... between the node CDV and the ground $V_{SS}$. These capacitors and switch transistors are provided as many as the number of bits of the inputted address signal. Respective bits of the inputted address signal and the activation signal ENP are inputted to a NAND gate for obtaining the negative logical sum. An output signal of each NAND gate is inputted to the gate of each corresponding switch transistor via an inverter.

Therefore, when the address of the memory cell to be written is designated while the activation signal ENP is supplied, the capacitance regulating part 44 selects the capacitors of a predetermined number from a plurality of capacitors $52_m$, $52_{m-1}$, ... based on the inputted address signal. Since these selected capacitors are all connected in parallel between the node CDV and the ground $V_{SS}$, a composite capacitance C between the node CDV and the ground $V_{SS}$ becomes equal to the value obtained by combining the capacitance $C_B$ of the capacitor 43 and the capacitance of the predetermined number of selected capacitors.

Accordingly, the bit line voltage $V_{bit}$ regulated to the constant level in the regulation circuit may be expressed as follows by replacing $C_B$ with C in the formula 2 (hereafter referred to as formula 3):

$$V_{bit}=V_{REF}\times(1+(C/C_A))$$
$$C=C_B+A_m\times C_m+A_{m-1}\times C_{m-1}+\dots,$$

wherein, $C_m$, $C_{m-1}$ ... are capacitances of the capacitors $52_m$, $52_{m-1}$, ...

As can be understood from the formula 3, the level of the bit line voltage $V_{bit}$ generated by the regulation circuit 32 can be regulated by selecting the capacitors of the adequate combination from a plurality of capacitors $53_m$, $52_{m-1}$, ... based on the writing address and then adequately setting the composite capacitance C.

More particularly, the capacitance regulating part 44 is structured to select the capacitors of a predetermined adequate combination from a plurality of capacitors $52_m$, $52_{m-1}$, ... so that a value of the composite capacitance C becomes larger as the wiring distance is longer, depending on the wiring distance via the bit line up to the memory cells to be written in the memory array from the output end VBO of the bit line voltage $V_{bit}$.

The practical capacitance values $C_m$, $C_{m-1}$, ... of a plurality of capacitors $52_m$, $52_{m-1}$, ... are determined depending on the capacitance value $C_B$ of the capacitor 43 and the bit level (what number the bit is from the least significant bit) of the corresponding address signal. However, it is desirable to set a larger capacitance value for the capacitor corresponding to the more significant bit of the address signal. That is, it is preferable that the capacitance values of capacitors are set to satisfy the relationship of $C_m>C_{m-1}>\dots$.

Therefore, in the regulation circuit of the present invention, the level of the bit line voltage $V_{bit}$ can be previously set to a higher value based on the writing address in order to set the actual voltage value at the drain of the memory cells to be written within the operation ensuring range, for example, within the range of 4 to 5V.

Therefore, in the non-volatile semiconductor memory of the present invention, since the level of the drain voltage during the writing operation can be set within a constant range in all memory cells in the memory cell array 11, fluctuation of the writing speed in each memory cell can be lowered.

As illustrated in FIG. 5, each node of the regulation circuit 32 is connected to the ground $V_{SS}$ via a transistor of which the inverted signal ENPB of the activation signal ENP is inputted to the gate. When the regulation circuit 32 is in the non-activated condition, each transistor is turned ON; and thereby, each node is fixed to the ground potential.

Figure 6:
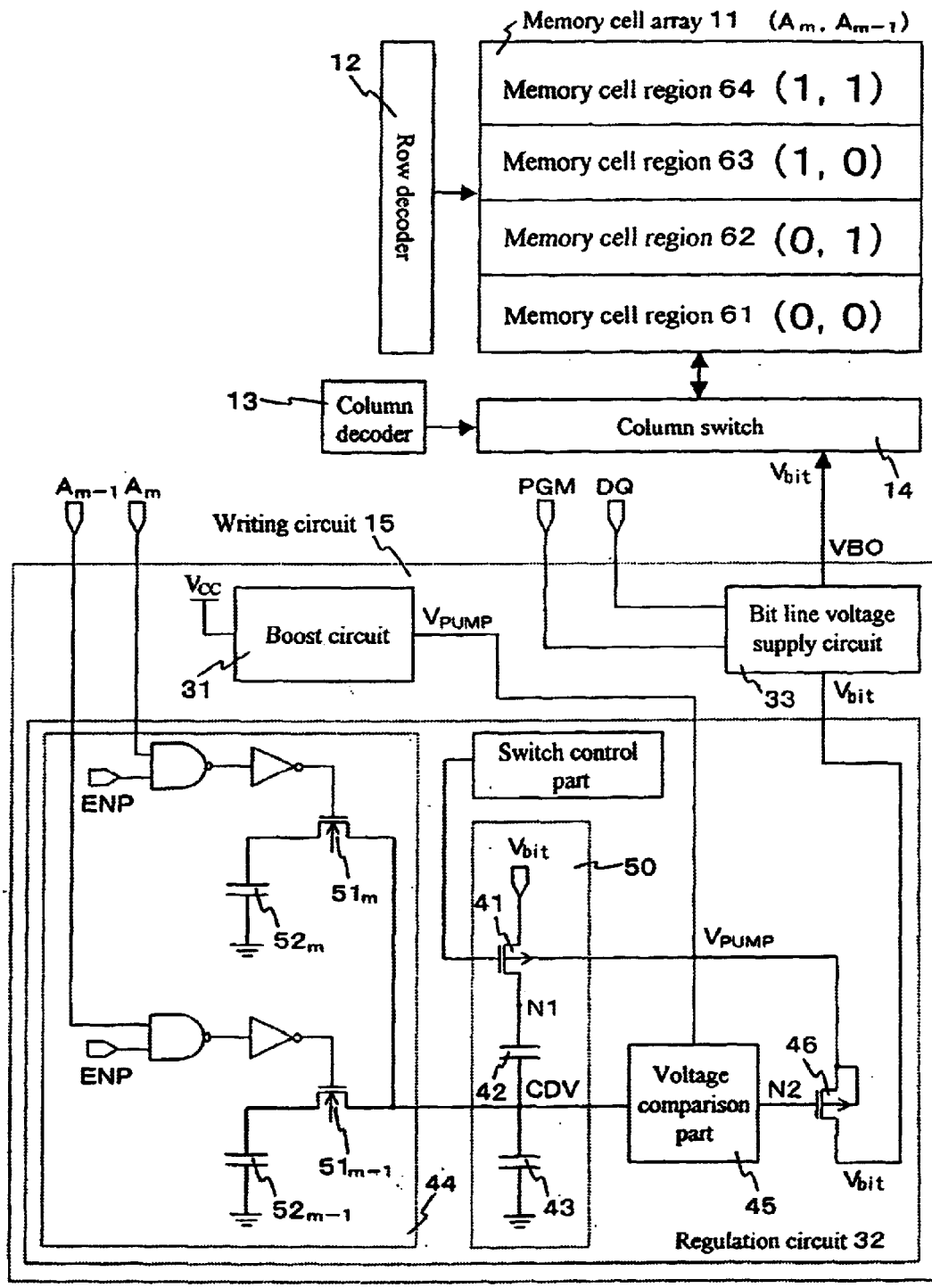
FIG. 6 is a schematic diagram of a non-volatile semiconductor memory for explaining the practical operation of the regulation circuit of the present invention.

FIG. 6 is a schematic diagram of a non-volatile semiconductor memory for explaining the practical operation of the regulation circuit. In this figure, the elements like those of FIG. 2 to FIG. 5 are designated with the like reference numerals.

Each circuit of FIG. 6 is basically identical to that illustrated in FIG. 2 to FIG. 5. However, it is assumed that the memory cell array 11 is structured of four memory cell regions 61 to 64 divided in the bit line direction and significant two bits of row address are identical for all included memory cells with reference to each memory cell region 61 to 64.

As will be understood from FIG. 6, the wiring distance from the output end VBO of the bit line voltage $V_{bit}$ becomes longest in the memory cell region 64 and becomes shortest in the memory cell region 61. As is illustrated in FIG. 6, the significant two bits $A_m$, $A_{m-1}$ of the corresponding row address are indicated in each memory cell regions in the format of ($A_m$, $A_{m-1}$). Corresponding to this indication, the significant two bits $A_m$, $A_{m-1}$ of the row address are inputted to the regulation circuit 32 in the writing circuit 15.

The regulation circuit of FIG. 6 is basically formed with the identical structure as the circuit structure of FIG. 5. However, as shown in FIG. 6, only two capacitors 52$_m$, 52$_{m-1}$ are provided as the transistors provided between the node CDV and ground VSS in the capacitance regulating part 44. This corresponds in such a way that the significant two bits $A_m$, $A_{m-1}$ of the row address is inputted to the regulation circuit 32. Here, capacitances Cm, $C_{m-1}$ of the capacitors 52$_m$, 52$_{m-1}$ are designed to satisfy at least the relationship of $C_m > C_{m-1}$.

The practical operations of the regulation circuit of the present invention will be explained in the following four cases with reference to FIG. 6.

(1) When the memory cells in the memory cell region 61 are to be written:
since the significant two bits of the writing address is respectively $A_m=0$, $A_{m-1}=0$, the bit line voltage $V_{bit,1}$ is expressed as follows from the formula 3 (hereafter referred to as formula 4):

$$V_{bit,1} = V_{REF} \times (1 + (C_B/C_A)).$$

(2) Similarly, when the memory cells in the memory cell region 62 are to be written:
since the significant two bits of the writing address are respectively $A_m=0$, $A_{m-1}=1$, the bit line voltage $V_{bit,2}$ is expressed as follows from the formula 3 (hereafter referred to as formula 5):

$$V_{bit,2} = V_{REF} \times (1 + (C_B + C_{m-1})/C_A).$$

(3) Similarly, when the memory cells in the memory cell region 63 are to be written:

since the significant two bits of the writing address are respectively $A_m=1$, $A_{m-1}=0$, the bit line voltage $V_{bit,3}$ is expressed as follows from the formula 3 (hereafter referred to as formula 6):

$$V_{bit,3} = V_{REF} \times (1 + (C_B + C_m)/C_A).$$

(4) Similarly, when the memory cells in the memory cell region 64 are to be written:
since the significant two bits of the writing address are respectively $A_m=1$, $A_{m-1}=1$, the bit line voltage $V_{bit,4}$ is expressed as follows from the formula 3 (hereafter referred to as formula 7):

$$V_{bit,4} = V_{REF} \times (1 + (C_B + C_{m-1} + C_m)/C_A).$$

Here, since the relationship of $C_m > C_{m-1}$ is satisfied as explained above, the relationship of $V_{bit,4} > V_{bit,3} > V_{bit,2} > V_{bit,1}$ can be satisfied from the formula 4 to 7 among the bit line voltages of the above cases (1) to (4).

In other words, the regulation circuit of the present invention is capable of changing the level of the bit line voltage $V_{bit}$ depending on the region to which the memory cells to be written belong among the memory cell regions 61 to 64 and the higher level of the bit line voltage can be set in the memory cell region where the wiring distance via the bit line from the output end VBO of the bit line voltage $V_{bit}$ is longer. More particularly, the level of the bit line voltage $V_{bit}$ becomes highest when the memory cells in the memory cell region 64 is to be written and becomes lowest when the memory cells in the memory cell region 61 is to be written.

A practical value of the bit line voltage $V_{bit}$ supplied to each memory cell region may be designed by adequately setting the capacitance values $C_A$, $C_B$, $C_m$, $C_{m-1}$ of the capacitors 42, 43, 52$_m$, 52$_{m-1}$.

Therefore, in the regulation circuit of the present invention, the bit line voltage $V_{bit}$ can be set to the adequate level based on the writing address so as to set the actual voltage value at the drain of the memory cell to be written within the operation ensuring range, for example, the range of 4 to 5V.

Consequently, in the non-volatile semiconductor memory of the present invention, since the level of drain voltage during the writing operation can be set within a constant range in all memory cells of the memory cell array 11, fluctuation of the writing speed in each memory cell can be reduced.

The regulation circuit of FIG. 5 and FIG. 6 is structured to vary, based on the writing address, the voltage $V_{CDV}$ of the node CDV which is one input voltage of the voltage comparing part 45. However, it can also be structured to vary, based on the writing address, the reference voltage $V_{REF}$ which is the other input voltage. It is possible that this reference voltage $V_{REF}$ is generally used even in the circuit other than the regulation circuit in the non-volatile semiconductor memory. Accordingly, attention is necessary for design of the non-volatile semiconductor memory when the reference voltage $V_{REF}$ is varied.

Moreover, in above embodiment, a non-volatile semiconductor memory (particularly, a flash memory) has been explained as an example. However, the present invention is never restricted thereto and allows application into a ferroelectric memory and a volatile semiconductor memory (such as, DRAM, SRAM).

In the non-volatile semiconductor memory of the present invention, the bit line voltage of the adequate level is supplied depending on the position of the memory cell in the memory cell array based on the writing address. Therefore, since the level of drain voltage during the writing operation can be set within a constant range, fluctuation of writing speed in each memory cell can be reduced. The present invention brings about much contribution to improvement in the performance of the non-volatile semiconductor memory.

While the present invention has been described in reference to a specific embodiment, the scope of the invention is not limited to that embodiment and is deemed to include the scope as set out in the appended claimed and their equivalents.

What is claimed is:

1. A semiconductor memory, comprising:
   a memory cell array including a plurality of memory cells which are disposed at intersections of a plurality of bit lines and word lines and are connected to said bit lines; and
   a writing circuit which receives an address signal and supplies a bit line voltage to the bit line connected to the memory cell selected with said address signal during writing operation, wherein
   said writing circuit changes, based on said address signal, a level of said bit line voltage depending on a position of said selected memory cell in said memory cell array.

2. The semiconductor memory according to claim 1, wherein said writing circuit raises the level of said bit line voltage to a higher level as a wiring distance is longer, depending on said wiring distance via said bit line from an output end of said bit line voltage to said selected memory cell.

3. The semiconductor memory according to claim 1, wherein said writing circuit comprises;
   a voltage boost circuit for outputting a boosted voltage having a level higher than a power source voltage by boosting said power source voltage; and
   a regulation circuit for inputting said boosted voltage and outputting said bit line voltage by regulating said boosted voltage to a predetermined voltage level, wherein
   said regulation circuit receives said address signal and changes, based on said address signal, said predetermined voltage level depending on the position of said selected memory cell.

4. The semiconductor memory according to claim 3, wherein said regulation circuit comprises:
   first and second capacitance parts which are sequentially connected in series between an output node of said bit line voltage and the ground;
   a voltage comparing part for comparing a voltage level of a connection node of said first and second capacitance parts with a reference voltage; and
   a transistor which is provided between an input node of said boosted voltage and the output node of said bit line voltage and is controlled for ON/OFF states based on comparison result in said voltage comparing part, wherein
   said regulation circuit changes a value of capacitance generated in said second capacitance part based on said address signal.

5. The semiconductor memory according to claim 4, wherein said second capacitance part comprises;
   a fixed capacitance capacitor provided between said connection node and said ground;
   a plurality of capacitors which are connected in parallel with said fixed capacitance capacitor between said connection node and said ground and are provided corresponding to respective bits of said address signal; and
   a plurality of switch transistors which are provided between said connection node and said plurality of capacitors and are controlled for ON/OFF states depending on levels of corresponding bits of said address signal, wherein
   said regulation circuit changes, based on said address signal, combinations of the switch transistors in the ON state from said plurality of switch transistors and selects the capacitors of a predetermined combination from said plurality of capacitors; and thereby, changes the value of capacitance generated in said second capacitance part.

6. The semiconductor memory according to claim 5, wherein each capacitance value of said plurality of capacitors is larger as the corresponding bit of said address signal is more significant bit.

7. The semiconductor memory according to claim 1, wherein the address signal inputted to said writing circuit is comprised of a part of bits of an address signal having a plurality of bits and is also comprised of a predetermined number of bits from the most significant bit.

8. The semiconductor memory according to claim 1, wherein said memory cell array is comprised of a plurality of blocks having block addresses and the address signal inputted to said writing circuit includes a block address signal.

9. The semiconductor memory according to claim 1, wherein said memory cell is a non-volatile memory cell having a floating gate and the writing operation is executed by injecting carriers to said floating gate through supply of said bit line voltage.

* * * * *